United States Patent
Sanchez Pinzon et al.

(10) Patent No.: US 11,815,043 B2
(45) Date of Patent: Nov. 14, 2023

(54) METHOD FOR DETECTING A SHORT CIRCUIT ACROSS A LOAD

(71) Applicant: Robert Bosch GmbH, Stuttgart (DE)

(72) Inventors: Federico Ignacio Sanchez Pinzon, Kornwestheim (DE); Johannes Zondler, Stuttgart (DE); Yannick Chauvet, Stuttgart (DE)

(73) Assignee: ROBERT BOSCH GMBH, Stuttgart (DE)

(*) Notice: Subject to any disclaimer, the term of this patent is extended or adjusted under 35 U.S.C. 154(b) by 1093 days.

(21) Appl. No.: 16/341,607

(22) PCT Filed: Oct. 2, 2017

(86) PCT No.: PCT/EP2017/074930
§ 371 (c)(1),
(2) Date: Apr. 12, 2019

(87) PCT Pub. No.: WO2018/069074
PCT Pub. Date: Apr. 19, 2018

(65) Prior Publication Data
US 2021/0341546 A1    Nov. 4, 2021

(30) Foreign Application Priority Data
Oct. 14, 2016   (DE) .................. 102016220030.5

(51) Int. Cl.
*G01R 31/52*       (2020.01)
*F02D 41/22*       (2006.01)
*F02D 41/20*       (2006.01)

(52) U.S. Cl.
CPC ............. *F02D 41/22* (2013.01); *G01R 31/52* (2020.01); *F02D 41/20* (2013.01); *F02D 2041/2093* (2013.01)

(58) Field of Classification Search
CPC ........ G01R 31/50; G01R 31/52; G01R 31/55; G01R 31/58; G01R 31/67; H03K 17/081–08116; F02D 41/22
See application file for complete search history.

(56) References Cited

U.S. PATENT DOCUMENTS 5,334,912 A * 8/1994 Counts ............... H05B 41/2851
                                                                315/225
5,896,057 A    4/1999 Chicca et al.
(Continued)

FOREIGN PATENT DOCUMENTS

CN       102959412 A       3/2013
CN       103959074 A       7/2014
(Continued)

OTHER PUBLICATIONS

International Search Report dated Feb. 16, 2018 of the corresponding International Application PCT/EP2017/074930 filed Oct. 2, 2017.

*Primary Examiner* — Patrick Assouad
*Assistant Examiner* — Demetrius R Pretlow
(74) *Attorney, Agent, or Firm* — NORTON ROSE FULBRIGHT US LLP; Gerard Messina

(57) ABSTRACT

A method includes determining a first voltage that is in a high-side path of a circuit, the path including a high-side switch connected between a first potential connection of the circuit and a first connection of a load of the circuit; determining a second voltage that is in a low-side path of the circuit, the path including a low-side switch connected between a second potential connection of the circuit and a second connection of the load; responsive to a determination that one of the voltages exceeds a threshold for at least a duration of a predefined time interval, checking whether the other voltage currently exceeds the threshold; and determining that there is a short circuit across the load or in (Continued)

whichever of the paths has the voltage that exceeded the threshold for the duration, respectively, if the result of the check is positive or negative.

12 Claims, 3 Drawing Sheets

(56) References Cited

U.S. PATENT DOCUMENTS

| | | | | |
|---|---|---|---|---|
| 6,056,384 | A * | 5/2000 | Sato | G01R 31/42 |
| | | | | 318/400.21 |
| 8,436,623 | B2 * | 5/2013 | Oura | F02D 41/22 |
| | | | | 324/537 |
| 9,325,267 | B2 * | 4/2016 | Barth | H02P 8/12 |
| 9,413,312 | B2 * | 8/2016 | Jiang | H03F 3/187 |
| 9,515,586 | B2 * | 12/2016 | Forscht | H02P 6/14 |
| 9,579,977 | B2 * | 2/2017 | Gale | B60L 3/04 |
| 2002/0021583 | A1 * | 2/2002 | Yoshida | G11C 16/3459 |
| | | | | 365/185.22 |
| 2008/0084229 | A1 * | 4/2008 | Frommer | G01R 31/34 |
| | | | | 324/765.01 |
| 2010/0246081 | A1 * | 9/2010 | Yano | B60L 58/40 |
| | | | | 361/91.5 |
| 2011/0074333 | A1 * | 3/2011 | Suzuki | H02P 25/22 |
| | | | | 318/724 |
| 2011/0156626 | A1 * | 6/2011 | Mukai | H02P 29/0241 |
| | | | | 318/400.21 |
| 2011/0234130 | A1 * | 9/2011 | Okumura | B62D 5/0487 |
| | | | | 318/400.07 |
| 2012/0242365 | A1 * | 9/2012 | Singh | G01R 31/42 |
| | | | | 324/762.01 |
| 2013/0049763 | A1 * | 2/2013 | Jiang | H02M 1/32 |
| | | | | 324/509 |
| 2013/0134985 | A1 * | 5/2013 | Bernardon | G01R 31/40 |
| | | | | 324/527 |
| 2013/0278273 | A1 * | 10/2013 | Barlag | G01R 31/58 |
| | | | | 324/537 |
| 2013/0320903 | A1 * | 12/2013 | Aalund | H02H 7/1225 |
| | | | | 318/490 |
| 2014/0049860 | A1 * | 2/2014 | Arima | G01R 31/52 |
| | | | | 361/42 |
| 2014/0268925 | A1 | 9/2014 | Lee et al. | |
| 2014/0333320 | A1 * | 11/2014 | Barnetova | G01R 31/66 |
| | | | | 324/503 |
| 2015/0008933 | A1 * | 1/2015 | Zuschlag | B60R 21/0173 |
| | | | | 324/503 |
| 2015/0054522 | A1 * | 2/2015 | Boettger | G01R 19/0038 |
| | | | | 324/509 |
| 2015/0145553 | A1 | 5/2015 | Pasqualetto | |
| 2015/0171779 | A1 * | 6/2015 | Forscht | G01R 31/40 |
| | | | | 318/400.29 |
| 2015/0214858 | A1 * | 7/2015 | Raichle | H02M 7/537 |
| | | | | 363/131 |
| 2015/0291088 | A1 * | 10/2015 | Ueno | H02H 7/122 |
| | | | | 315/77 |
| 2015/0354522 | A1 * | 12/2015 | Hoban, Jr. | G01R 31/005 |
| | | | | 73/114.45 |
| 2016/0056750 | A1 * | 2/2016 | West | G01R 31/42 |
| | | | | 318/490 |
| 2016/0252568 | A1 * | 9/2016 | Muto | G01R 31/52 |
| | | | | 318/494 |
| 2016/0258993 | A1 * | 9/2016 | Bagchi | G01R 31/52 |
| 2016/0341776 | A1 * | 11/2016 | Sekine | H02M 1/32 |
| 2016/0380589 | A1 * | 12/2016 | Morita | H02S 50/10 |
| | | | | 324/509 |
| 2017/0276715 | A1 * | 9/2017 | Heinz | G01R 31/42 |
| 2018/0145503 | A1 * | 5/2018 | Minagawa | H02M 1/00 |

FOREIGN PATENT DOCUMENTS

| | | | | |
|---|---|---|---|---|
| CN | 102396147 | B * | 2/2015 | H02P 29/0241 |
| CN | 104569713 | A * | 4/2015 | G01R 31/024 |
| CN | 104852644 | A * | 8/2015 | G01R 31/40 |
| CN | 106771784 | A * | 5/2017 | |
| DE | 102004037543 | A1 | 3/2006 | |
| DE | 102006030594 | A1 | 1/2008 | |
| DE | 102007046488 | A1 | 4/2009 | |
| DE | 102007050298 | A1 | 4/2009 | |
| DE | 102007050298 | A1 * | 4/2009 | H02H 7/0838 |
| DE | 102012108912 | A1 | 4/2013 | |
| DE | 102011088912 | A1 | 6/2013 | |
| DE | 102014206777 | A1 * | 10/2014 | F02D 41/221 |
| DE | 102014212586 | B3 * | 12/2015 | G01R 31/343 |
| EP | 0810444 | A1 | 12/1997 | |
| JP | 2010115082 | A * | 5/2010 | G01R 31/343 |
| KR | 20080055074 | A * | 6/2008 | |
| KR | 20140103166 | A * | 8/2014 | G01R 31/52 |
| KR | 20170113572 | A * | 10/2017 | G01R 31/62 |
| WO | WO-2009043657 | A1 * | 4/2009 | H02H 7/0838 |
| WO | WO-2014116761 | A1 * | 7/2014 | H02M 1/32 |
| WO | 2015118772 | A1 | 8/2015 | |
| WO | WO-2015166699 | A1 * | 11/2015 | G01R 31/52 |

* cited by examiner

METHOD FOR DETECTING A SHORT CIRCUIT ACROSS A LOAD

CROSS-REFERENCE TO RELATED APPLICATIONS

The present application is the national stage of International Pat. App. No. PCT/EP2017/074930 filed Oct. 2, 2017, and claims priority under 35 U.S.C. § 119 to DE 10 2016 220 030.5, filed in the Federal Republic of Germany on Oct. 14, 2016, the content of each of which are incorporated herein by reference in their entireties.

FIELD OF THE INVENTION

The present invention relates to a method for detecting a short circuit across a load in a circuit configuration including the load, a high-side path, and a low-side path, relates to a processing unit, and relates to an executable computer program.

BACKGROUND

Bridge circuits, for example, can be used in motor vehicles for controlling electromagnetic actuators such as fuel injectors or valves, for example. For this purpose, bridge circuit can have a load, e.g., an inductive load, which can be controlled via a multitude of switches. A first portion of the switches can be connected between the inductive load and a high potential in one or a plurality of high-side path(s), while another portion of the switches is connected between the inductive load and a low potential in one or a plurality of low-side path(s).

In European patent 810444 A1, the current in a high-side path and the current in a low-side path of a circuit configuration are compared to a threshold value in each case. A short circuit across the load is detected when an overcurrent situation is present in both paths at the same time for at least the filter time.

In printed publication DE 10 2011 088 912 A1, different threshold values for the high-side path and the low-side path are monitored.

SUMMARY

Example embodiments of the present invention are directed to a method for detecting a short circuit across a load in a circuit configuration having the load, a high-side path and a low-side path; a processing unit; and a computer program. Example embodiments are the subject matter of the following description.

In the high-side path of the circuit configuration, a high-side switch is connected between a first potential connection and a first connection of the load. In the low-side path, a low-side switch is connected between a second potential connection and the second connection of the load. The load is controlled by the high-side and the low-side switches. For example, the load can be developed as an inductive load, e.g., as a coil.

In an advantageous manner, the first potential connection is electrically connected to a relatively high potential, e.g., to a supply voltage, and the second potential connection is advantageously connected to a relatively low potential, in particular to ground.

A single switching element can be used as the high-side or the low-side switch in each case, or also a number of switching elements of possibly different designs. For example, it is possible to use transistors, in particular MOSFET transistors or IGBTs as high-side and low-side switches.

In the context of a method according to an example embodiment of the present invention, a short circuit across the load or a short circuit of the first and the second connection of the load is able to be detected. Toward this end, a first voltage value (as an indicator of the current in the path) is determined in the high-side path, and a second voltage value (as an indicator of the current in the path) is determined in the low-side path.

In the context of a first check, it is checked whether the first voltage value or the second voltage value exceeds a threshold value for at least the duration of a predefined time interval (known as the filter time). If this is the case, i.e., if one of the two voltage values exceeds the threshold value for at least the duration of the time interval, a second check is carried out. In the context of this second check, it is checked whether the other one of the two voltage values currently exceeds the threshold value. If this is also the case, then a short circuit across the load is detected. For practical purposes, a comparator can be provided for comparing the respective voltage value to the threshold value in each case.

A simple exceeding of this threshold value points to an overcurrent, in particular. Such an overcurrent especially results in a corresponding overvoltage. This can also be a brief overcurrent due to regular voltage fluctuations. However, if such an overvoltage continues for the duration of the predefined time interval, then this points to a short circuit.

This does not necessarily involve a short circuit across the load but could also be a short circuit in the respective path. When the first voltage value in the high-side path exceeds the threshold value at least for the time interval, it could particularly involve a short circuit to ground. When the second voltage value in the low-side path exceeds the threshold value for at least the time interval, then it could involve a short circuit to the voltage supply or battery, in particular.

In a short circuit across the load, such a permanent overcurrent occurs both in the high-side path and the low-side path. More specifically, the current through the high-side switch and the low-side switch, and thus also the first and the second voltage value, are identical or essentially identical.

The present invention exploits this circumstance. If a short circuit in one of the two paths was already detected, i.e., when one of the two voltage values exceeds the threshold value for at least the time interval and when at least one overcurrent is detected in the other of the two paths, i.e., when the other of the two voltage values currently exceeds the threshold value, a short circuit across the load is inferred. In such a case, it is unlikely or at least barely likely that a short circuit is present in one of the two paths and an overcurrent in the other one of the two paths is present at the same time, so that a short circuit across the load can reliably be inferred given such a circumstance.

The present invention thus offers a simple possibility for rapidly and reliably detecting a short circuit across the load. The two voltage values are expediently determined anyway during the regular operation of the circuit configuration, which means that no additional measuring work is required.

Because of component tolerances, it is not always true that an overcurrent for both paths is detected at exactly the same time. Conventional methods therefore often require complex and time-intensive sequence controls to be carried out, in the course of which the individual high-side and low-side switches are switched on and off multiple times in different combinations in order to enable a reliable detection of a short circuit across the load. Not only does it take a relatively long time to detect a short circuit across the load utilizing conventional methods, but the corresponding components are also heavily stressed by the sequence control.

In contrast, the present invention allows for a material-sparing and the most rapid detection of load short circuits possible. In particular, no material-stressing sequence control is necessary. Moreover, no additional switching effort is required, in particular, and, for the most part, the detection is able to be carried out in a digital component, advantageously in a control unit. Since this control unit does not have to carry out a complex sequence control, it can be kept smaller and is less expensive than a control unit for the execution of conventional methods. In the same way, a software for executing the method can be less complex, thereby saving additional costs.

In the context of the present invention, a short circuit across the load is also detected when the first voltage value and the second voltage value exceed the threshold value at the same time during the predefined time interval.

As mentioned above, it is also possible to use different threshold values for short-circuit detection methods. In the present method, on the other hand, the same threshold value is monitored for both paths, so that the present method is able to be carried out at a considerably lower expense.

It is of course understood that the load is also controllable with the aid of a bridge circuit or an H-bridge circuit. Accordingly, a second high-side switch can be connected in a second high-side path between the first potential connection and the second connection of the load. A second low-side switch can be connected in a second low-side path between the second potential connection and the first connection of the load.

The present description is meant to apply equally to such second high-side and low-side switches without limiting the generality. If "the high-side switch" and "the low-side switch" are mentioned in the description, then this should be understood as the particular switches of the individual high-side and low-side paths that are opened or are carrying current for controlling the load.

Using the present method, a short circuit in the high-side path or the low-side path is advantageously also detectable and able to be distinguished from a short circuit across the load.

If one of the two voltage values exceeds the threshold value at least for the duration of the predefined time interval and if the other of the two voltage values currently does not exceed the threshold value, then it is advantageously detected that a short circuit has occurred in the particular path in which the voltage value that exceeds the threshold value for the duration of the predefined time interval is determined.

According to an example embodiment, a respective bit is set in a register for as long as it is detected that the first and/or the second voltage value exceed(s) the threshold value. More specifically, a bit of this type is thus provided both for the high-side path and the low-side path. Accordingly, it is noted in the respective register that an overcurrent is currently identified in one of the paths.

The step of checking whether the other one of the two voltage values currently exceeds the threshold value preferably includes a check as to whether a corresponding bit is set in the register for the other of the two voltage values. This significantly simplifies the second evaluation step so that it is essentially able to be concluded immediately.

The first voltage value is advantageously determined as a voltage drop across the high-side switch. The second voltage value is advantageously determined as a voltage drop across the low-side switch. In these cases, the voltage values can particularly be determined as voltage drops across a drain-source resistor of the respective switch. This constitutes an inexpensive method for ascertaining the current in the respective path.

Preferably, a first resistance element is connected in the high-side path, in particular a shunt resistance. This first resistance element is advantageously connected between the high-side switch and a first potential connection. The first voltage value is preferably determined as a voltage drop across this first resistance element. In an advantageous manner, it is alternatively or additionally possible to provide such a shunt resistance in the low-side path as well. In this case, a second resistance element is preferably connected in the low-side path, advantageously between the low-side switch and the second potential connection. The second voltage value is preferably determined as a voltage drop across this second resistance element. This is a time-tested and precise method for ascertaining the current in the respective path.

The circuit configuration is advantageously used in a motor vehicle. Preferably, an element in a motor vehicle, in particular an actuator of the motor vehicle, is thereby controlled as the load. For example, the load can be a coil (e.g., for generating a magnetic field; a magneto armature, e.g., a valve, flap, or injector; etc.). In this case, the first potential connection can be electrically connected to the supply voltage of a vehicle electrical system or to a vehicle battery, for example, and the second potential connection can be connected to the vehicle ground.

In a particularly advantageous manner, a short circuit across a load in a motor vehicle is therefore detectable with the aid of the present method. More specifically, a timely detection of a defect of a corresponding actuator is possible as a result, and corresponding measures can be taken to ensure that no safety risk for the entire motor vehicle can ensue on account of a defect of the actuator.

An electromagnetically controllable actuator is preferably controlled as the load. For example, a physical variable that is influenced by the actuator is able to be controlled to a desired setpoint value by a pulsed control. Using the pulsed control, in particular in the context of a pulse-width modulation, the actuator is advantageously able to be controlled in a stepless manner and a corresponding physical variable influenced by the actuator is able to be continuously varied.

An injector, or a solenoid injector, in particular a fuel injector, is advantageously controlled by controlling the load. By controlling the inductive load, a solenoid armature, in particular, is moved out of its neutral position, thereby releasing a flow of fuel. The solenoid armature is able to be retained in a desired position, in particular through a pulsed control, so that a flow rate of the fuel or an injected fuel quantity is able to be controlled.

A valve, such as a valve of an internal combustion engine, e.g., an exhaust-gas recirculation valve, is preferably able to be controlled using the load. The valve can be opened, particularly from its closed position, through the control of the inductive load. In particular using a pulsed control, especially similar to an injector, the valve is able to be kept in a desired open position.

The load is preferably used to control a flap such as a throttle valve for the control of an aspirated air quantity of an internal combustion engine. The open position of such a flap can also be kept at a desired value, in particular with the aid of a pulsed control.

According to an example embodiment, a processing unit according to the present invention, e.g., a control unit of a motor vehicle, is set up, especially in terms of processing technology, to carry out a method as described herein.

The implementation of the present method in the form of a computer program is also advantageous since it causes particularly low expense, especially if an executing control unit is used for further tasks as well and is therefore provided as it is. Suitable data carriers for supplying the computer program particularly are magnetic, optical and electrical memories, e.g., hard disks, flash memories, EEPROMs, DVDs and the like. A download of a program via computer networks (Internet, intranet, etc.) is another possibility.

A further implementation of the memory option can be an internal sequence control including logic gates/registers in an integrated switching circuit (IC).

Additional advantages and embodiments of the present invention result from the description and the appended drawings in which the present invention is schematically illustrated based on example embodiments, described in the following text with reference to the drawings.

DETAILED DESCRIPTION

Figure 1:
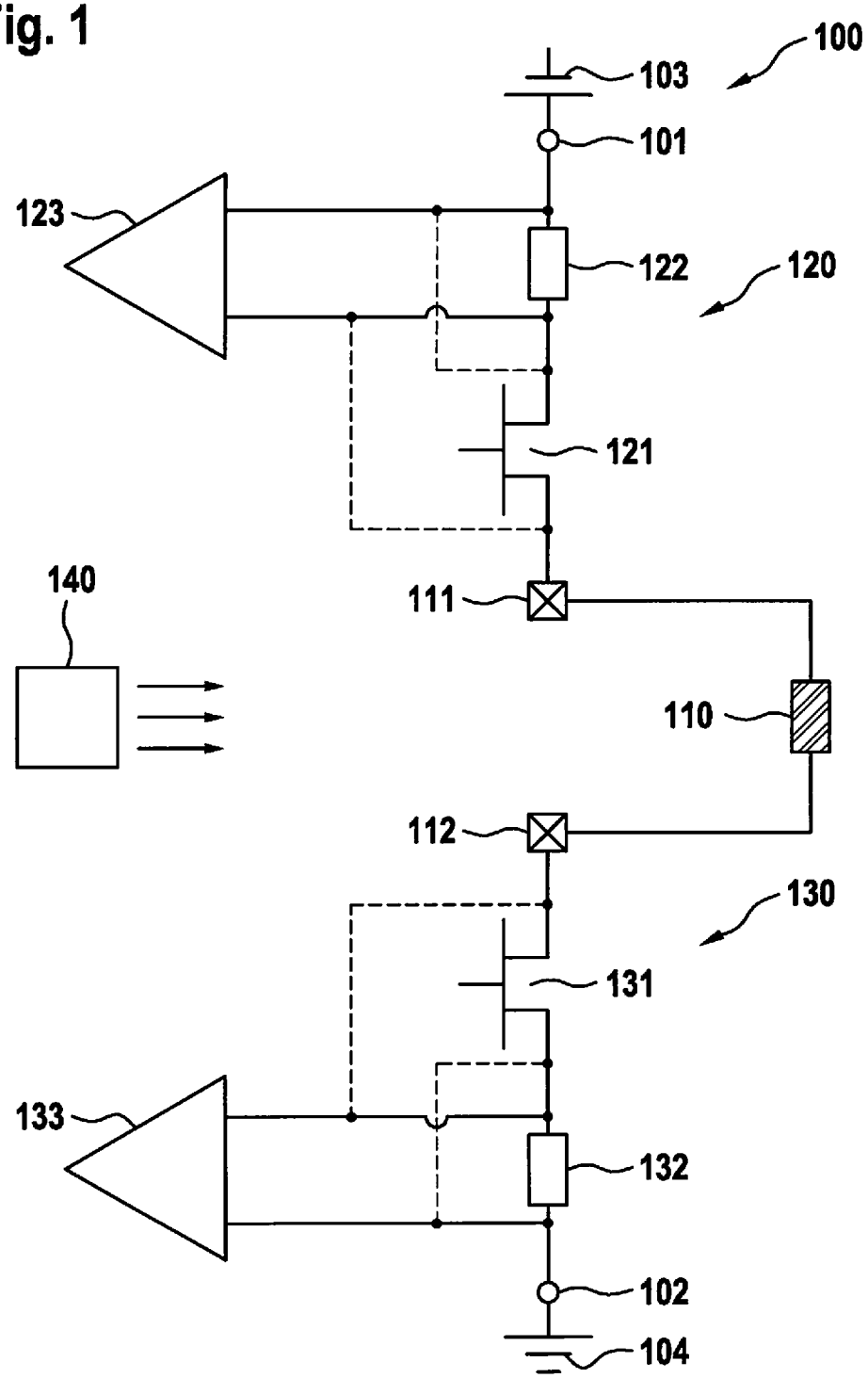
FIG. 1 schematically shows a circuit configuration having a load, in which a short circuit across the load can be detected by a method according to an example embodiment of the present invention.

FIG. 1 schematically shows a circuit configuration 100 having a load 110. For example, circuit configuration 100 is situated in a motor vehicle. Load 110 is developed as an inductive load in this example, e.g., as a coil, and is part of a valve of an internal combustion engine such as an exhaust-gas recirculation valve, for instance. Load 110 can also be developed as an ohmic load, for example.

Circuit configuration 100 is connected between a first potential connection 101 and a second potential connection 102. First potential connection 101, for example, is electrically connected to a motor vehicle battery 103 in a vehicle electrical system, and second potential connection 102 is connected to ground 104. Load 110 has a first connection 111 and a second connection 112.

A high-side switch 121 is connected in a high-side path 120 between first potential connection 101 and first connection 111 of load 110. In addition, a first resistance element 122 or a first shunt resistance 122 is connected in high-side path 120 between high-side switch 121 and first potential connection 101.

A low-side switch 131 is connected in a low-side path between second potential connection 102 and second connection 112 of load 110. A second resistance element 132 or a second shunt resistance 132 is connected between low-side switch 131 and second potential connection 102. For example, high-side and low-side switches 121, 131 can be developed as a MOSFET resistor in each case.

A first comparator 123 is provided in order to determine a first voltage value in high-side path 120 and to compare it to a threshold value. For instance, a voltage drop across a drain-source resistance of high-side switch 121, in particular when no shunt resistance is provided, and/or a voltage drop across first shunt resistance 122 can be determined as a first voltage value.

A second comparator 133 is provided in order to determine a second voltage value in low-side path 130 and to compare it to a threshold value. Similar to the first voltage value, this second voltage value, too, can be determined as a voltage drop across a drain-source resistance of low-side switch 131, in particular when no shunt resistance is provided, and/or it can be determined as a voltage drop across the second shunt resistance 132.

A control unit 140 is provided for the control of switches 121, 131. Using the control, in particular a current through load 110 can be adjusted and the corresponding valve can be opened, especially from its closed position, or vice versa. In particular using a pulsed control, the valve is able to be kept in a desired position.

In the context of a preferred example embodiment of a method according to the present invention, it is possible to identify whether a short circuit across load 110 or a short circuit between the first and second connection 111 and 112 is present. For this purpose, control unit 140 is set up, especially in terms of programming technology, to carry out a preferred example embodiment of a method according to the present invention, as described in the further text with reference to FIG. 3.

Figure 2:
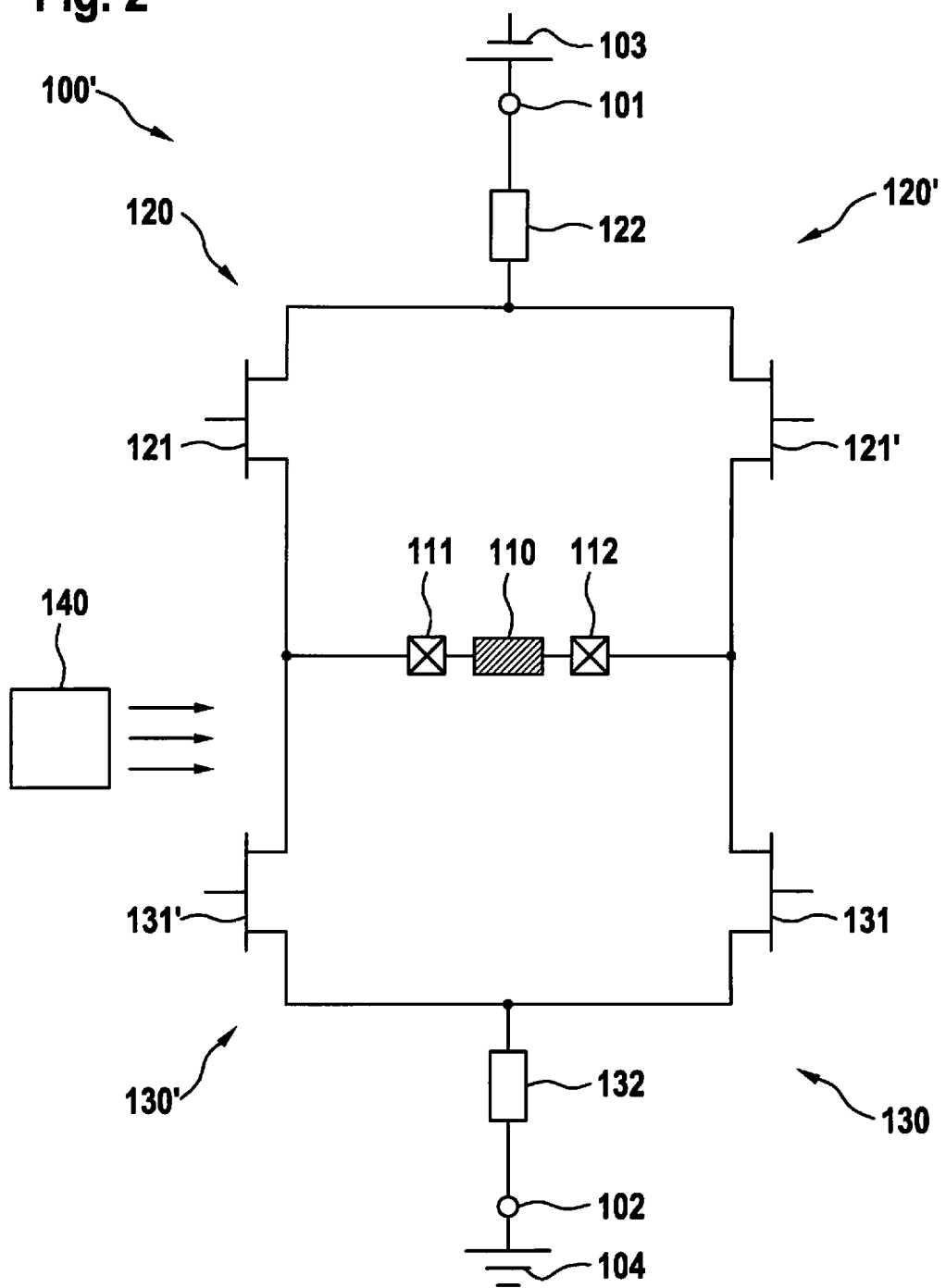
FIG. 2 schematically shows a further circuit configuration having a load, in which a short circuit across the load can be detected by a method according to an example embodiment of the present invention.

The circuit configuration can also be developed as an H-bridge circuit, for instance. Such an H-bridge circuit is schematically illustrated in FIG. 2 and denoted by 100'. Identical reference numerals in the figures denote identical elements or elements having the same design.

In addition, H-bridge circuit 100' has a second high-side path 120' and a second low-side path 130'. A second high-side switch 121' is connected in second high-side path 120' between first potential connection 101 and second connection 112 of load 110. A second low-side switch 131' is connected between second potential connection 102 and first connection 111 of load 110 in second low-side path 130'.

In the illustrated example, shunt resistances 122 and 132 are jointly provided for both high-side paths 120 and 120' and for both low-side paths 130 and 130'. However, it is also possible to provide a separate shunt resistance for each high-side path 120, 120' and for each low-side path 130, 130'.

It is possible to provide corresponding comparators for individual high-side and low-side paths 120, 120', 130, 130', which are not shown in FIG. 2 for reasons of clarity.

Figure 3:
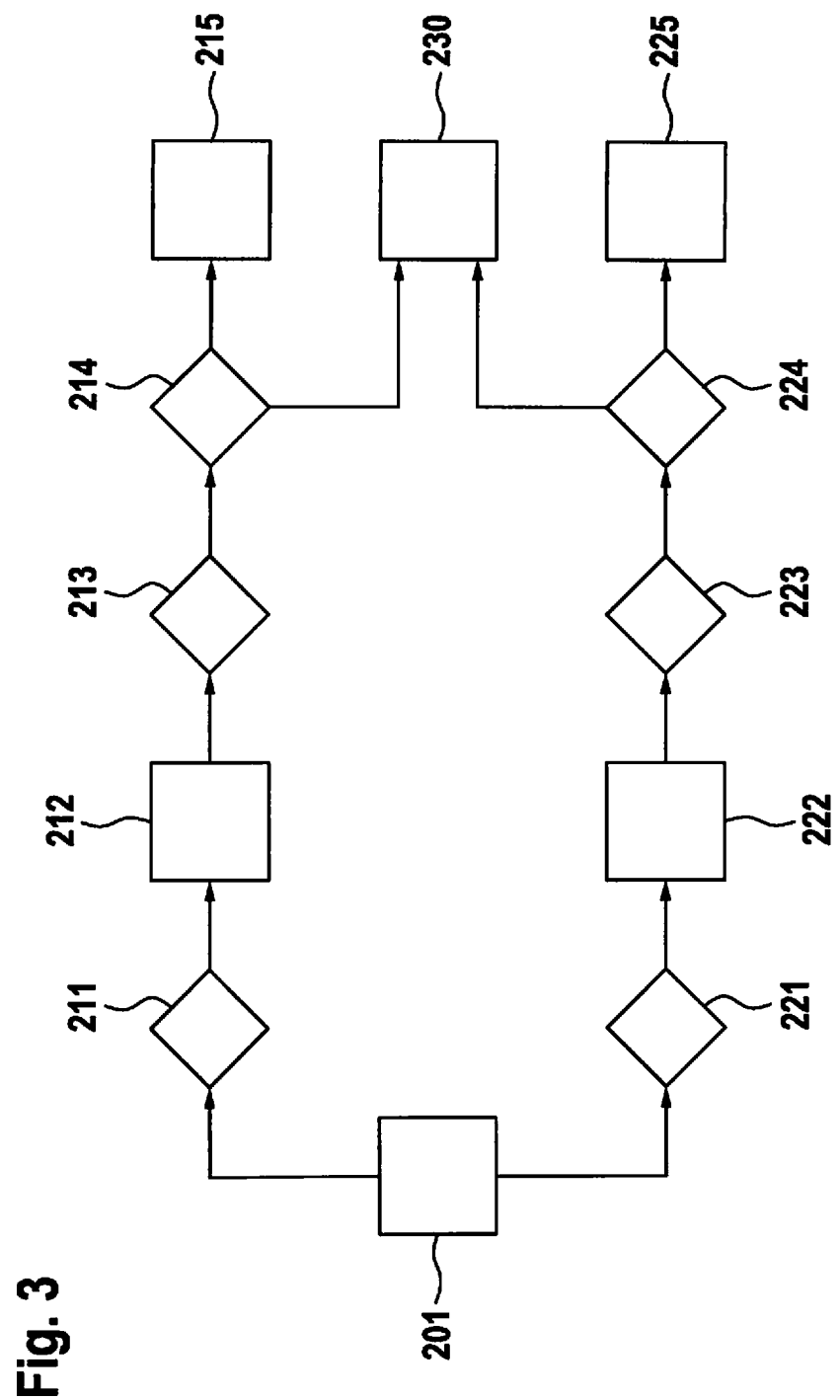
FIG. 3 is a flowchart that schematically illustrates a method according to an example embodiment of the present invention.

In the following text, a preferred development of the method according to the present invention is described, which is schematically shown in FIG. 3 in the form of a block diagram. Merely by way of example, the present method will be described with reference to high-side path 120 having high-side switch 121 and low-side path 130 having low-side switch 131, but it applies analogously to high-side path 120' having high-side switch 121' and to low-side path 130' having low-side switch 131'.

According to step 201, the first voltage value is determined as a voltage drop across the drain-source resistance of high-side switch 121 or across shunt resistance 122. The voltage drop across the drain-source resistance of low-side switch 131 or across shunt resistance 132 is determined as the second voltage value.

In a step 211, comparator 123 checks whether the first voltage value exceeds a threshold value. If this is the case, it indicates an overcurrent in high-side path 120, from which a corresponding overvoltage results.

When an exceeding of the threshold value is detected, a corresponding bit is set in a register in control unit 140 in step 212. A time counter is also started when this bit is set.

In step 213, it is checked whether the first voltage value exceeds the threshold value for at least a predefined time interval (what is known as the filter time). If this is not the case, then the overcurrent has occurred simply as a result of the usual voltage fluctuations.

However, if the first voltage value exceeds the threshold value at all times for at least the complete time interval, then this points to a short circuit. This could be a short circuit to ground or a short circuit across load 110.

In order to distinguish which type of short circuit is involved, it is checked in step 214 whether the second voltage value currently also exceeds the threshold value. More specifically, it is checked for this purpose whether a corresponding bit is currently set in the register.

If the second voltage value currently does not exceed the threshold value, then a short circuit to ground is detected according to step 215. If the second voltage value currently also exceeds the threshold value, then it is detected according to step 230 that a short circuit across load 110 has occurred.

In a similar manner, in the context of the present method, comparator 133 can check in step 221 whether the second voltage value exceeds the threshold value. When an exceedance is detected in step 222, a corresponding bit is set in the register and the time counter is started.

In step 223, similar to step 213, it is checked whether the second voltage value exceeds the threshold value for at least the time interval. If only a brief overcurrent is present, then this is not the case. When the second voltage value exceeds the threshold value at all times for at least the complete time interval, then this points either to a short circuit to the battery or a short circuit across load 110.

In step 224, it is checked whether the first voltage value currently also exceeds the threshold value, in particular in that it is checked whether the corresponding bit is currently set in the register.

If the first voltage value currently does not exceed the threshold value, then a short circuit to the battery is detected according to step 225. A short circuit across load 110 is detected according to step 230 if the first voltage value currently also exceeds the threshold value.

What is claimed is:

1. A method for a circuit that includes a load, a high-side path in which a high-side switch is connected between a first potential connection and a first connection of the load, and a low-side path in which a low-side switch is connected between a second potential connection and a second connection of the load, the method comprising:
   determining, via a first comparator and a second comparator, respectively, a first voltage value in the high-side path and a second voltage value in the low-side path;
   responsive to a determination that one of the first and second voltage values exceeds a threshold value for at least a duration of a predefined time interval, checking, via at least one of the first comparator and the second comparator, whether the other of the first and second voltage values currently exceeds the threshold value; and
   responsive to the result of the checking being that the threshold value is not currently exceeded by the other voltage value, determining, via a control unit, that there is a short circuit in whichever of the paths has the voltage value that had been determined to exceed the threshold value for at least the duration of the predefined time interval,
   wherein a short circuit across the load is also determined when the first voltage value and the second voltage value exceed the threshold value at the same time during the predefined time interval.

2. The method of claim 1, wherein the method includes the step of determining that there is the short circuit across the load responsive to the result of the checking being that the threshold value is currently exceeded by the other voltage value.

3. A method for a circuit that includes a load, a high-side path in which a high-side switch is connected between a first potential connection and a first connection of the load, and a low-side path in which a low-side switch is connected between a second potential connection and a second connection of the load, the method comprising:
   determining, via a first comparator and a second comparator, respectively, a first voltage value in the high-side path and a second voltage value in the low-side path;
   responsive to a determination that one of the first and second voltage values exceeds a threshold value for at least a duration of a predefined time interval, checking, via at least one of the first comparator and the second comparator, whether the other of the first and second voltage values currently exceeds the threshold value; and
   either:
     responsive to a result of the checking being that the threshold value is currently exceeded by the other voltage value, determining, via a control unit, that there is a short circuit across the load; or
     responsive to the result of the checking being that the threshold value is not currently exceeded by the other voltage value, determining, via the control unit, that there is a short circuit in whichever of the paths has the voltage value that had been determined to exceed the threshold value for at least the duration of the predefined time interval,
   with respect to each of the first and second voltage values, whenever the respective voltage value exceeds the threshold value, setting a respective bit in a register,
   wherein a short circuit across the load is also determined when the first voltage value and the second voltage value exceed the threshold value at the same time during the predefined time interval.

4. The method of claim 3, wherein the checking includes checking whether the respective bit corresponding to the other voltage value is set in the register.

5. The method of claim 1, wherein at least one of (a) the first voltage value is determined as a voltage drop across the high-side switch and (b) the second voltage value is determined as a voltage drop across the low-side switch.

6. A method for a circuit that includes a load, a high-side path in which a high-side switch is connected between a first potential connection and a first connection of the load, and a low-side path in which a low-side switch is connected between a second potential connection and a second connection of the load, the method comprising:
- determining, via a first comparator and a second comparator, respectively, a first voltage value in the high-side path and a second voltage value in the low-side path;
- responsive to a determination that one of the first and second voltage values exceeds a threshold value for at least a duration of a predefined time interval, checking, via at least one of the first comparator and the second comparator, whether the other of the first and second voltage values currently exceeds the threshold value; and
- either:
  - responsive to a result of the checking being that the threshold value is currently exceeded by the other voltage value, determining, via a control unit, that there is a short circuit across the load; or
  - responsive to the result of the checking being that the threshold value is not currently exceeded by the other voltage value, determining, via the control unit, that there is a short circuit in whichever of the paths has the voltage value that had been determined to exceed the threshold value for at least the duration of the predefined time interval,
  - wherein a resistance element is connected in the high-side path, and the first voltage value is determined as a voltage drop across the resistance element,
  - wherein a short circuit across the load is also determined when the first voltage value and the second voltage value exceed the threshold value at the same time during the predefined time interval.

7. A method for a circuit that includes a load, a high-side path in which a high-side switch is connected between a first potential connection and a first connection of the load, and a low-side path in which a low-side switch is connected between a second potential connection and a second connection of the load, the method comprising:
- determining, via a first comparator and a second comparator, respectively, a first voltage value in the high-side path and a second voltage value in the low-side path;
- responsive to a determination that one of the first and second voltage values exceeds a threshold value for at least a duration of a predefined time interval, checking, via at least one of the first comparator and the second comparator, whether the other of the first and second voltage values currently exceeds the threshold value; and
- either:
  - responsive to a result of the checking being that the threshold value is currently exceeded by the other voltage value, determining, via a control unit, that there is a short circuit across the load; or
  - responsive to the result of the checking being that the threshold value is not currently exceeded by the other voltage value, determining, via the control unit, that there is a short circuit in whichever of the paths has the voltage value that had been determined to exceed the threshold value for at least the duration of the predefined time interval,
  - wherein a resistance element is connected in the low-side path and the second voltage value is determined as a voltage drop across the resistance element,
  - wherein a short circuit across the load is also determined when the first voltage value and the second voltage value exceed the threshold value at the same time during the predefined time interval.

8. A method for a circuit that includes a load, a high-side path in which a high-side switch is connected between a first potential connection and a first connection of the load, and a low-side path in which a low-side switch is connected between a second potential connection and a second connection of the load, the method comprising:
- determining, via a first comparator and a second comparator, respectively, a first voltage value in the high-side path and a second voltage value in the low-side path;
- responsive to a determination that one of the first and second voltage values exceeds a threshold value for at least a duration of a predefined time interval, checking, via at least one of the first comparator and the second comparator, whether the other of the first and second voltage values currently exceeds the threshold value; and
- either:
  - responsive to a result of the checking being that the threshold value is currently exceeded by the other voltage value, determining, via a control unit, that there is a short circuit across the load; or
  - responsive to the result of the checking being that the threshold value is not currently exceeded by the other voltage value, determining, via the control unit, that there is a short circuit in whichever of the paths has the voltage value that had been determined to exceed the threshold value for at least the duration of the predefined time interval,
  - wherein a first resistance element is connected in the high-side path, a second resistance element is connected in the low-side path, the first voltage value is determined as a voltage drop across the first resistance element, and the second voltage value is determined as a voltage drop across the second resistance element,
- wherein a short circuit across the load is also determined when the first voltage value and the second voltage value exceed the threshold value at the same time during the predefined time interval.

9. A device comprising a processor, wherein the processor is programmed to:
- determine, via a first comparator and a second comparator, respectively, a first voltage value that is in a high-side path of a circuit, wherein the circuit also includes a load and wherein the high-side path includes a high-side switch connected between a first potential connection of the circuit and a first connection of the load;
- determine a second voltage value that is in a low-side path of the circuit, wherein the low-side path includes a low-side switch connected between a second potential connection of the circuit and a second connection of the load;
- responsive to a determination that one of the first and second voltage values exceeds a threshold value for at least a duration of a predefined time interval, check, via at least one of the first comparator and the second comparator, whether the other of the first and second voltage values currently exceeds the threshold value; and
- responsive to the result of the checking being that the threshold value is not currently exceeded by the other voltage value, determine, via a control unit, that there is a short circuit in whichever of the paths has the voltage value that had been determined to exceed the threshold value for at least the duration of the predefined time interval, wherein a short circuit across the load is also determined when the first voltage value and the second voltage value exceed the threshold value at the same time during the predefined time interval.

10. The device of claim 9, wherein the processor is programmed to determine that there is the short circuit across the load responsive to the result of the check being that the threshold value is currently exceeded by the other voltage value.

11. A non-transitory computer-readable medium on which are stored instructions that are executable by a processor and that, when executed by the processor, cause the processor to perform a method for a circuit that includes a load, a high-side path in which a high-side switch is connected between a first potential connection and a first connection of the load, and a low-side path in which a low-side switch is connected between a second potential connection and a second connection of the load, wherein the instructions include:

one or more instructions that, when executed by the processor, causes the processor to determine, via a first comparator and a second comparator, respectively, a first voltage value in the high-side path and a second voltage value in the low-side path;

one or more instructions that, when executed by the processor, causes the processor to, responsive to a determination that one of the first and second voltage values exceeds a threshold value for at least a duration of a predefined time interval, check, via at least one of the first comparator and the second comparator, whether the other of the first and second voltage values currently exceeds the threshold value; and one or more instructions that, when executed by the processor, causes the processor to, responsive to the result of the checking being that the threshold value is not currently exceeded by the other voltage value, determine, via a control unit, that there is a short circuit in whichever of the paths has the voltage value that had been determined to exceed the threshold value for at least the duration of the predefined time interval, wherein a short circuit across the load is also determined when the first voltage value and the second voltage value exceed the threshold value at the same time during the predefined time interval.

12. The non-transitory computer-readable medium of claim 11, wherein the instructions include the one or more instructions that, when executed by the processor, causes the processor to, responsive to the result of the checking being that the threshold value is currently exceeded by the other voltage value, determine that there is the short circuit across the load.

\* \* \* \* \*